US008785256B2

(12) United States Patent
Shimizu et al.

(10) Patent No.: US 8,785,256 B2
(45) Date of Patent: Jul. 22, 2014

(54) METHOD OF MANUFACTURING SEMICONDUCTOR PACKAGE

(71) Applicant: Shinko Electric Industries Co., Ltd., Nagano (JP)

(72) Inventors: Noriyoshi Shimizu, Nagano (JP); Akio Rokugawa, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 13/736,470

(22) Filed: Jan. 8, 2013

(65) Prior Publication Data

US 2013/0122657 A1 May 16, 2013

Related U.S. Application Data

(62) Division of application No. 12/951,509, filed on Nov. 22, 2010, now Pat. No. 8,378,492.

(30) Foreign Application Priority Data

Dec. 4, 2009 (JP) .................................. 2009-276270

(51) Int. Cl.
*H01L 21/44* (2006.01)
*H01L 21/48* (2006.01)
*H01L 21/50* (2006.01)

(52) U.S. Cl.
USPC .......................................... 438/127; 257/773

(58) Field of Classification Search
USPC ................... 438/127; 257/773, 779, E21.502
See application file for complete search history.

(56) References Cited

U.S. PATENT DOCUMENTS

| 5,923,954 | A * | 7/1999 | Cho ............................... 438/108 |
| 6,002,592 | A * | 12/1999 | Nakamura et al. ........... 361/760 |
| 8,080,880 | B2 | 12/2011 | Brunnbauer et al. |
| 8,278,746 | B2 * | 10/2012 | Ding et al. .................... 257/686 |
| 2006/0017133 | A1 * | 1/2006 | Oi et al. ........................ 257/528 |
| 2007/0007664 | A1 | 1/2007 | Lee et al. |
| 2008/0138937 | A1 * | 6/2008 | Yamagata ..................... 438/124 |
| 2010/0225001 | A1 * | 9/2010 | Hizume ........................ 257/773 |
| 2010/0300737 | A1 * | 12/2010 | Sato et al. ..................... 174/260 |
| 2011/0049726 | A1 | 3/2011 | Chino et al. |
| 2011/0108999 | A1 * | 5/2011 | Nalla et al. .................... 257/784 |
| 2011/0156261 | A1 * | 6/2011 | Kapusta et al. ............... 257/773 |
| 2012/0038053 | A1 * | 2/2012 | Oh et al. ....................... 257/773 |

FOREIGN PATENT DOCUMENTS

| JP | 2001-217381 | 8/2001 |
| JP | 2004-047931 | 2/2004 |
| JP | 2004-327724 | 11/2004 |
| JP | 2008-288481 | 11/2008 |
| WO | 02/15266 | 2/2002 |
| WO | 02/33751 | 4/2002 |

OTHER PUBLICATIONS

Japanese Office Action with English Translation dated Jun. 4, 2013, 13 pages.

* cited by examiner

*Primary Examiner* — Phuc Dang
(74) *Attorney, Agent, or Firm* — Rankin, Hill & Clark LLP

(57) ABSTRACT

There is provided a method of manufacturing a semiconductor package. The method includes: (a) providing a semiconductor chip having a first surface and a second surface opposite to the first surface, wherein a pad is formed on the first surface; (b) disposing the semiconductor chip on a supporting substrate such that the first surface is directed upward; (c) forming an encapsulation resin layer on the supporting substrate so as to cover the semiconductor chip; and (d) polishing the encapsulation resin layer to expose a top surface of the pad.

13 Claims, 15 Drawing Sheets

METHOD OF MANUFACTURING SEMICONDUCTOR PACKAGE

CROSS-REFERENCE TO RELATED APPLICATIONS

This application claims priority from prior Japanese Patent Application No. 2009-276270, filed on Dec. 4, 2009, the entire contents of which are incorporated herein by reference.

BACKGROUND

1. Technical Field

The present disclosure relates to a semiconductor package and a method of manufacturing the same.

2. Related Art

Recently, the performance of electronic devices using semiconductor devices such as semiconductor chips become increasingly powerful. With this situation, there are needs of high density in mounting the semiconductor chips on a substrate, and miniaturization and space-saving of the substrate onto which the semiconductor chips are mounted.

For those reasons, there have been proposed various structures, for example, chip built-in semiconductor packages in which semiconductor chips are buried. Moreover, there have been proposed various approaches, i.e., methods of manufacturing the chip built-in semiconductor packages (see e.g., WO 2002/15266 and WO 2002/33751).

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages According to one or more illustrative aspects of the invention, there is provided a method of manufacturing a semiconductor package. The method includes: (a) providing a semiconductor chip having a first surface and a second surface opposite to the first surface, wherein a pad is formed on the first surface; (b) disposing the semiconductor chip on a supporting substrate such that the first surface is directed upward; (c) forming an encapsulation resin layer on the supporting substrate so as to cover the semiconductor chip; and (d) polishing the encapsulation resin layer to expose a top surface of the pad.

Other aspects and advantages of the present invention will be apparent from the following description, the drawings and the claims.

DETAILED DESCRIPTION OF EXEMPLARY EMBODIMENTS

First of all, a method for manufacturing a semiconductor package 101 made by the inventors for test and examination will be now described.

Figure 11:
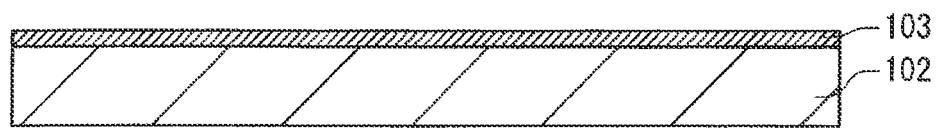
FIG. 11 shows a view illustrating a method of manufacturing a semiconductor package made by the inventors for test and examination.

In the method for manufacturing the semiconductor package, firstly, as shown in FIG. 11, sheet type fixing material 103 made of resin material (for example, epoxy resin) is formed by a roll laminating method on a supporting substrate 102 made of a copper plate having a thickness of about 0.2 mm to about 0.5 mm.

Figure 12:
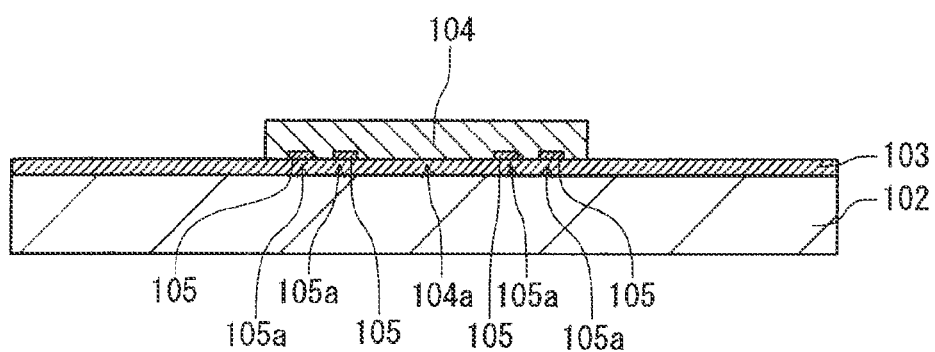
FIG. 12 shows a view illustrating a method of manufacturing a semiconductor package made by the inventors for test and examination.

Thereafter, as shown in FIG. 12, a semiconductor chip 104 is disposed on the supporting substrate 102 via the fixing material 103 such that an active surface 104a thereof is directed downward. Also, the semiconductor chip 14 is disposed on the supported substrate using a mounting apparatus.

Figure 13:
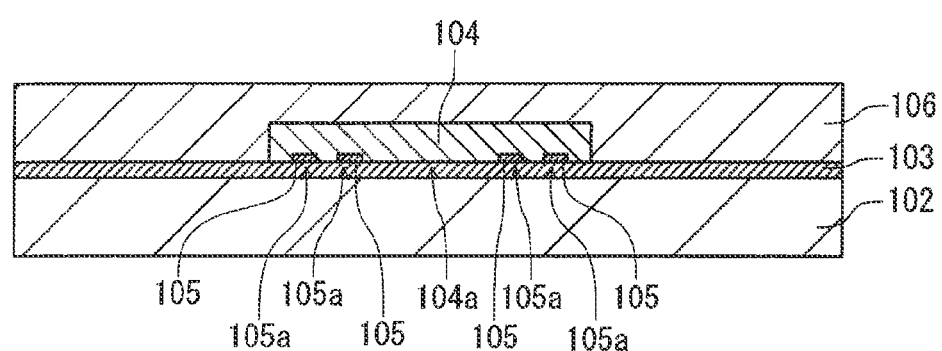
FIG. 13 shows a view illustrating a method of manufacturing a semiconductor package made by the inventors for test and examination.

Next, as shown in FIG. 13, an insulating layer 106 made of molding resin is formed on the supporting substrate 102 so as to cover the semiconductor chip 104.

Figure 14:
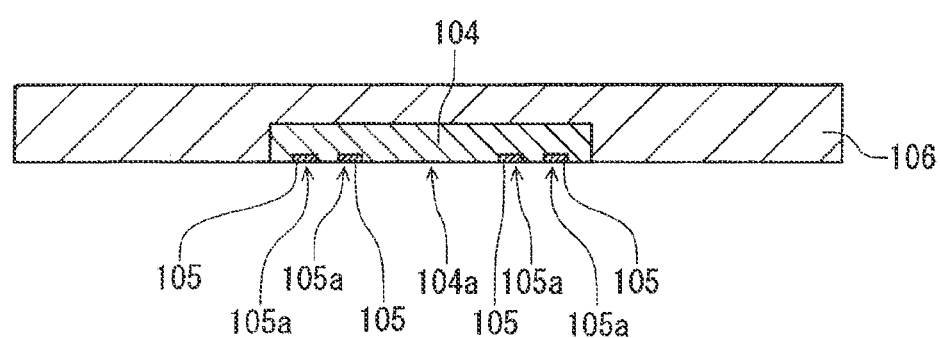
FIG. 14 shows a view illustrating a method of manufacturing a semiconductor package made by the inventors for test and examination.

Subsequently, as shown in FIG. 14, the supporting substrate 102 is removed by an etching method using aqueous solution containing cupper chloride dehydrate. Thereafter, the fixing material 103 is removed.

Figure 15:
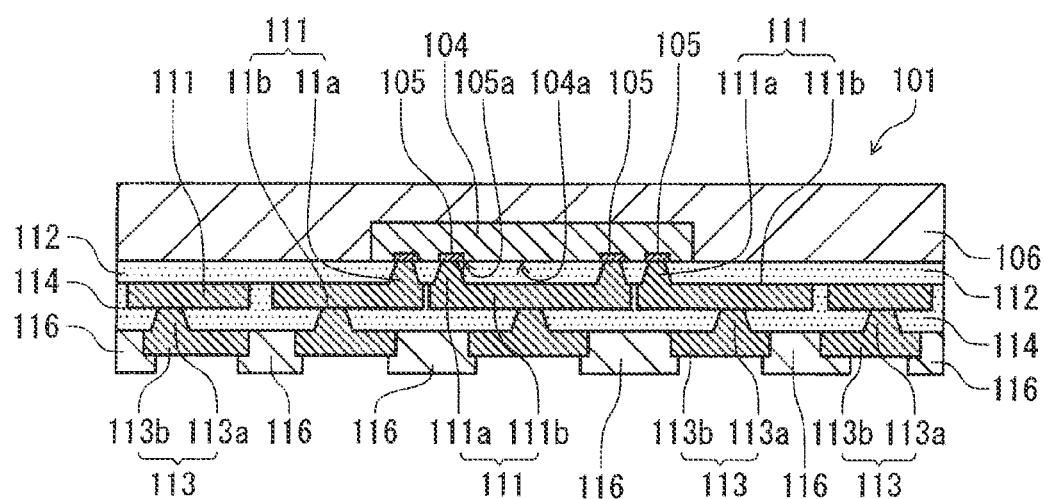
FIG. 15 shows a view illustrating a method of manufacturing a semiconductor package made by the inventors for test and examination.

Thereafter, as shown in FIG. 15, a plurality of wiring layers and insulating layers are built up on the active surface 104a of the semiconductor chip 104.

In the above-mentioned method for manufacturing the semiconductor package, however, in the process as shown in FIG. 13, the molding resin may enter between the fixing material (bonding sheet) 103 and pads 105 of the semiconductor chip 104 which is temporarily mounted when pressure is applied under heating. That is, when the resin enter between the material 103 and the pads 105, the resin remains on surfaces 105a of the pads 105, so that the remained resin affects connections between the pad 105 and the wiring layer 111 (here, a via 111a) in the build-up process. This leads to electrical connection errors between them. Meanwhile, it is difficult to control amount or area of the resin.

Further, in the build-up process as shown in FIG. 15, since only the insulating layer 106 serves as a layer for supporting the semiconductor chip 104, there is a problem in that the semiconductor package is likely to bend easily during the process (especially, in the process of carrying the package).

Furthermore, in this semiconductor package, the semiconductor chip 104 is embedded by the molding resin, it is hard to decrease the thickness of the insulating layer 106 (see FIG. 15).

Hereinafter, exemplary embodiments of the present invention will be described with reference to the drawings.

Firstly, a method for manufacturing a semiconductor package 1 according to the embodiment will be described. FIGS. 1 to 10 show schematic views (cross-sectional views) illustrating the method for manufacturing the semiconductor package 1. In the meanwhile, as described later, in the present invention, a wiring layer 11 and an insulating layer 12 are much thinner than an electronic component 4 and an insulating layer 6. However, for convenience of illustration, the sum of thicknesses of the wiring layer 11 and the insulating layer 12, in the drawings, is larger than the thickness of the insulating layer 6. (This is also applied to a wiring layer 13 and an insulating layer 14). Besides, the sizes or scales of some portions in each drawing are different from the actual sizes or scales for convenience of illustration.

Figure 1:
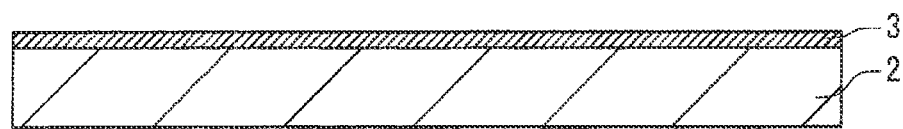
FIG. 1 shows a view illustrating a method of manufacturing a semiconductor package according to the embodiment of the present invention.

As shown in FIG. 1, a supporting substrate 2 is provided. Then, a fixing material 3 is disposed on an upper surface of the supporting substrate 2. In one example, the supporting substrate 2 may be a copper plate having the thickness of about 0.2 to 0.4 mm. In another example, the supporting substrate 2 may be a metal plate or a metal foil made of aluminum, nickel, iron or the like which can be removed by etching.

The fixing material 3 may be a bonding sheet made of resin material (for example, epoxy resin). Also, the fixing material 3 may be adhered onto the supporting substrate 2 by a laminating method such as a roll laminating method, a vacuum laminating method, etc. Alternatively, an adhesive agent made of epoxy, polyimide or the like may be used as the fixing material 3.

In another example, thermally removable adhesive agent which, for example, contains a blowing agent which expands when heated at a certain temperature may be used as the fixing material 3 (an effect of this example will be described later).

Figure 2:
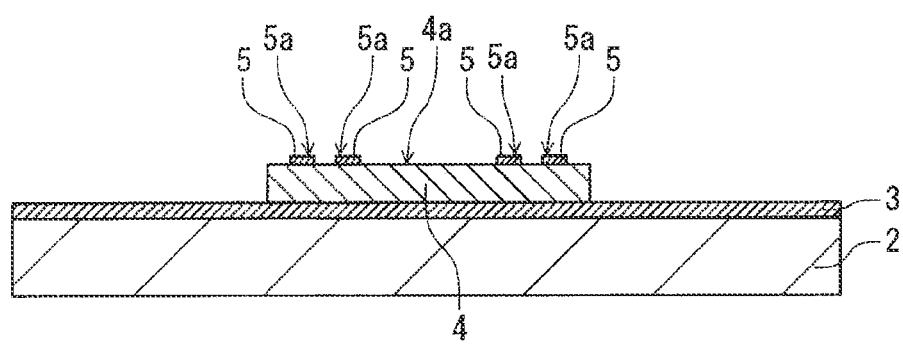
FIG. 2 shows a view illustrating a method of manufacturing a semiconductor package according to the embodiment of the present invention.

Thereafter, as shown in FIG. 2, an electronic component 4 is disposed on the supporting substrate 2 via the fixing material 3 such that an active surface 4a thereof is directed upward. In one example, the electronic component 4 is disposed on the supporting substrate 2, and then the fixing material 3 is cured. Hence, a rear surface of the electronic component 4 is bonded to the supporting substrate 2, so that, in following manufacturing process, it is possible to prevent the electronic component 4 from deviating from its position. In one example, the material 3 may be cured at about 170 to 190° C. for about 30 to 60 minutes.

Here, an example in which the electronic component 4 is a semiconductor chip will be now described. It is apparent that devices other than the semiconductor chip may be used as the electronic component 4. For example, a passive device such as a chip capacitor, resistor or an inductor may be used as the electronic component 4.

Pads 5 are formed on the active surface (pad formation face) 4a of the electronic component (semiconductor chip) 4 so as to be electrically connected to vias. (described later in details). In one example, the pads 5 are formed using copper on a flat aluminum pad connected to a circuit of the semiconductor chip 4.

In one example, the semiconductor chip 4 has a square shape of about 12 mm×12 mm and a thickness of about 75 to 500 μm (in this embodiment, about 375 μm). The pad 5 has a circular pillar shape having a diameter of about 110 μm and a height of about 10 to 30 μm (in this embodiment, about 25 μm).

Figure 3:
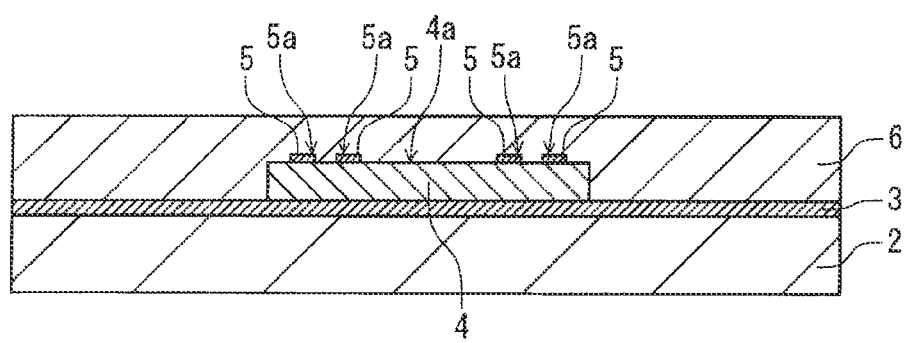
FIG. 3 shows a view illustrating a method of manufacturing a semiconductor package according to the embodiment of the present invention.

Next, as shown in FIG. 3, an insulating layer (encapsulation resin layer) 6 is formed on the supporting substrate 2 using molding resin so as to cover the semiconductor chip 4. Thereafter, the molding resin is cured. In this way, side surfaces of the semiconductor chip 4 are covered with the insulating layer (encapsulation resin layer) 6, and also the active surface (pad formation surface) 4a of the semiconductor chip 4 is covered with the insulating layer (encapsulation resin layer) 6. In one example, in the manufactured semiconductor package 1, the width of the insulating layer (encapsulation resin layer) 6 around the side surface of the semiconductor chip 4 becomes about 0.2 mm to about 6 mm (in this embodiment, about 1.5 mm). In this manner, wiring layers or external connection pads are formed on the insulating layer 6 around the side surface of the semiconductor chip, so that it is possible to make the semiconductor package with multiple terminals.

Moreover, in this embodiment, resin material (in this embodiment, epoxy resin) containing filler (for example, silicon dioxide or alumina) may be used as the molding resin. For example, the content rate of the filler may be about 50 to 80 wt %. Moreover, the resin layer 6 may be cured at about 200° C. for about 60 minutes, for example.

In addition, the insulating layer (encapsulation resin layer) 6 may be formed using a transfer molding method, an injection molding method, a potting method or the like.

Figure 4:
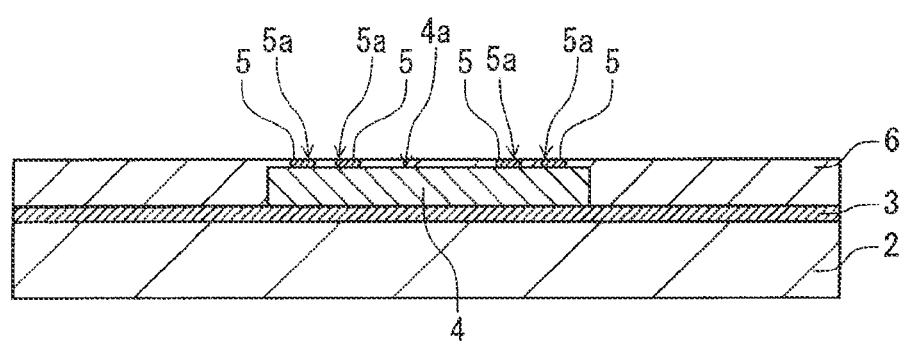
FIG. 4 shows a view illustrating a method of manufacturing a semiconductor package according to the embodiment of the present invention.

Subsequently, as shown in FIG. 4, a top surface of the insulating layer 6 is polished until a top surface 5a of the pad 5 of the semiconductor chip 4 is exposed. In one example, the polishing may be performed by mechanical methods such as grinding or polishing. Here, a thickness of the insulating layer 6 varies depending on the thickness of the semiconductor chip 4. For example, the thickness of the insulating layer 6 is about 85 μm to 600 μm (in this embodiment, about 400 μm), and the thickness of the insulating layer (encapsulation resin layer) 6 on the active surface (pad formation surface) 4a of the semiconductor chip 4 is about 10 μm to 30 μm (in this embodiment, about 25 μm). It is possible to protect securely the active surface 4a of the semiconductor chip 4 with the thickness of the insulating layer (encapsulation resin layer) 6.

When the top surface (polished face) of the insulating layer 6 is substantially flush with the top surface 5a of the pad 5, it is possible to form a multilayer structure including the wiring layer 11 and the insulating layer 12 on the insulating layer 6 with good precision level in subsequent processes.

Further, after the polishing process, it is advantageous to add a smoothing process which smoothes the top surfaces 5a of the pads 5 using a CMP (Chemical Mechanical Polishing) method or an etching method.

Next, the wiring layer 11, including an interlayer connection via 11a and a wiring pattern 11b, and the insulating layer 12 are formed on the insulating layer 6. According to the present invention, the wiring layer 11 and the insulating layer 12 are built up as thin films on the insulating layer 6. For example, the thickness of the wiring pattern 11b is about 3 μm, and the thickness of the insulating layer 12 is about 6 to 7 μm.

Figure 5:
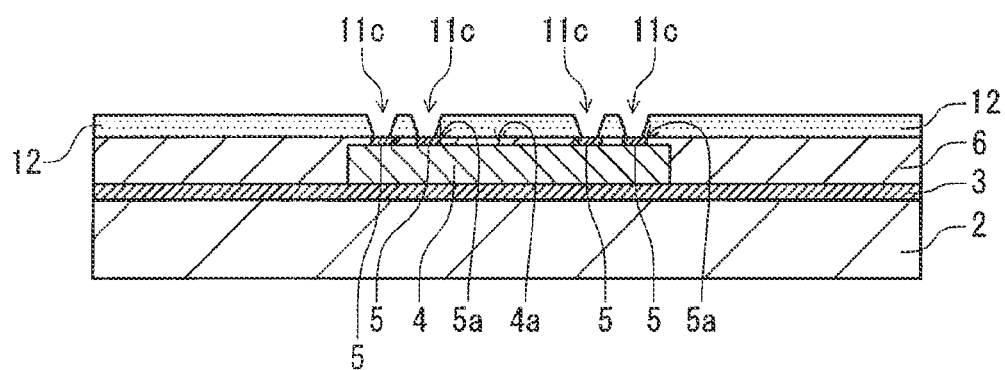
FIG. 5 shows a view illustrating a method of manufacturing a semiconductor package according to the embodiment of the present invention.

Firstly, as shown in FIG. 5, the insulating layer 12 made of photo-sensitive resin material such as photo-sensitive epoxy or photo-sensitive polyimide is formed on the insulating layer 6 using a screen printing method, a resin film laminating method, a coating method or the like. Next, the insulating layer 12 is subjected to patterning through exposure and development using a mask pattern (not shown). so that openings 11c are formed at via formation positions (as can be seen from FIG. 5, upper positions of the pads 5) so as to expose top surfaces 5a of the pads 5. Then, the insulating layer 12 is cured.

In the meanwhile, alter, the insulating layer 12 may be formed using insulation resin such as photo-insensitive epoxy or photo-insensitive polyimide and, then, the openings 11c for the vias 11a may be formed using a laser (this is equally applied to an insulating layer 14 and vias 13a as described later).

In a following process, a seed layer (not shown) is formed on the insulating layer 12 using a sputtering method. At this time, the seed layer is formed on inner wall faces of the openings 11c. In one example, the seed layer is consisted of two layers, i.e. a titanium layer/a copper layer whose thickness are about 50 nm/500 nm (here, the copper layer becomes a surface layer). Alternatively, the seed layer may be formed using an electroless copper plating method.

Subsequently, a plated resist layer is formed on the seed layer and, then, the plated resist layer is subjected to patterning through exposure and development, so that the seed layer is exposed at positions at which the wiring pattern 11b is to be formed.

Next, an electrolytic copper plating method is carried out by feeding electrical power from the seed layer, and then the plated copper is deposited onto the positions at which the seed layer is exposed. In this way, the plated copper fills the openings for the vias.

Thereafter, the plated resist layer is removed, and then the seed layer which is exposed by removing the plated resist layer is removed. Thus, the wiring layer 11 including the vias 11a and the wiring pattern 11b is formed.

Moreover, instead of the above mentioned method (semi-active method), different methods such as a subtractive method may be employed in forming the wiring layer 11.

Figure 6:
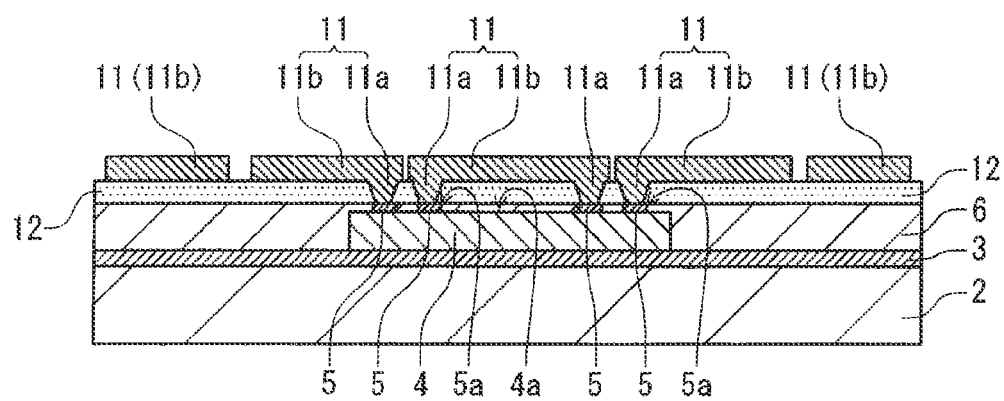
FIG. 6 shows a view illustrating a method for manufacturing a semiconductor package according to the embodiment of the present invention.

In this way, through the processes as shown in FIG. 5 and FIG. 6, the wiring layer 11 and the insulating layer 12 are formed and, the wiring layer 11 is connected to the pads 5 (here, the top surface 5a) of the semiconductor chip 4.

The insulating layer (encapsulation resin layer) 6, as described above, contains the filler for improving sealing performance. Accordingly, in case the wiring layer 12 is formed directly on the insulating layer 6, the wiring layer 6 may not be in close contact with the insulating layer 6 and, thus, the wiring pattern may be peeled off. However, in the present invention, the insulating layer 12 is formed on the insulating layer (encapsulation resin layer) 6 and, then, the wiring layer 11 is formed on the insulating layer 12. Accordingly, the wiring layer 11 can be in close contact with the insulating layer 12.

Figure 7:
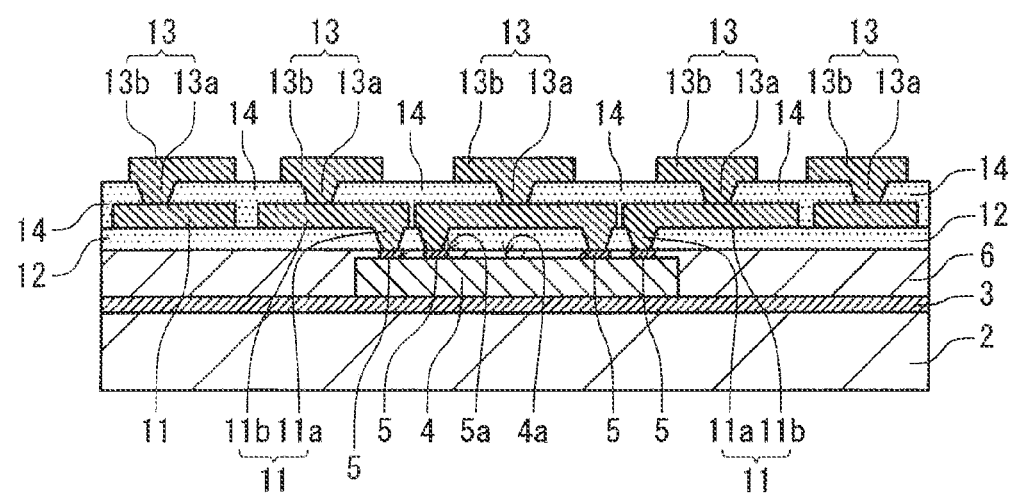
FIG. 7 shows a view illustrating a method for manufacturing a semiconductor package according to the embodiment of the present invention.

As shown in FIG. 7, the processes as shown in FIG. 5 and FIG. 6 are repeatedly performed, so that the wiring layers 13 and the insulating layers 14 are alternatively formed (built up), resulting in forming a multilayer structure.

In one example, the processes after forming the wiring layer 13 are substantially the same as the processes after forming the wiring layer 11, and the processes after forming the insulating layer 14 are substantially the same as those after forming the insulating layer 12. Meanwhile, the thickness of a wiring pattern 13b is about 10 μm, and the thickness of the insulating layer 14 is about 10 μm.

Figure 8:
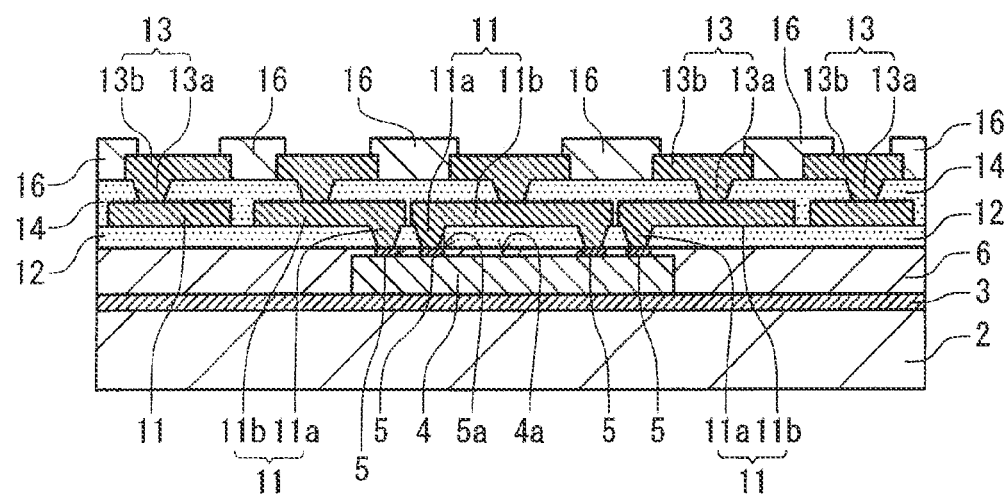
FIG. 8 shows a view illustrating a method for manufacturing a semiconductor package according to the embodiment of the present invention.

As shown in FIG. 8, a solder resist film 16 is formed as an uppermost layer using a printing method, etc. At this time, openings are formed in the film 16 to expose portions of the wiring layer 13. The portions of the wiring layer 13 exposed through the openings becomes external connection pads. For example, the diameter of each of the pads is about 300 μm, and the thickness of the solder resist film 16 is about 20 μm. In the meantime, a nickel plated layer and a gold plated layer may be formed in order on the pads using the electroless plating method so that surfaces of the pad are protected.

The external connection pads provided on the wiring layer 13 may form external connection terminals together with solder balls or lead pins connected to the pads, and, otherwise, the pads itself may form the external connection terminals.

Figure 9:
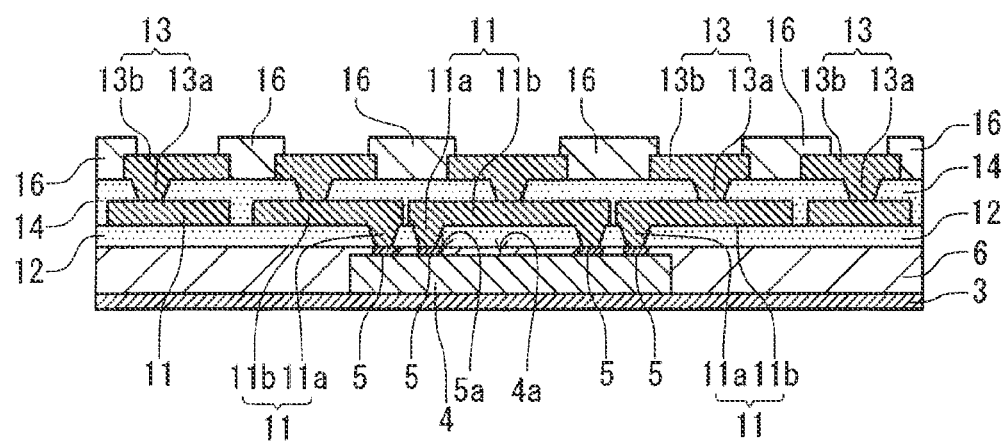
FIG. 9 shows a view illustrating a method for manufacturing a semiconductor package according to the embodiment of the present invention.

Next, as shown in FIG. 9, the supporting substrate 2 (formed as a lowermost layer of the multilayer structure) is removed. For example, in this embodiment, the supporting substrate 2 is made of the copper, the substrate 2 is removed by an etching method using aqueous solution containing Cu-chloride.

Figure 10:
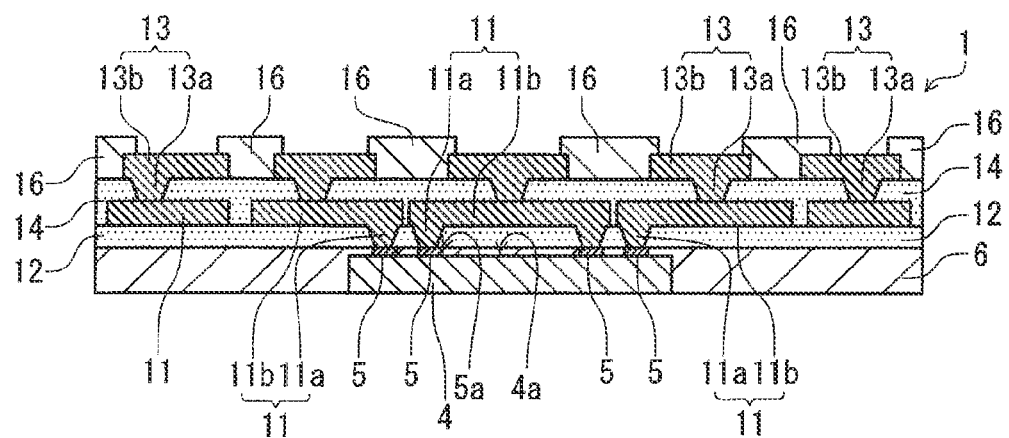
FIG. 10 shows a view illustrating a method for manufacturing a semiconductor package according to the embodiment of the present invention.

As shown in FIG. 10, after the supporting substrate 2 is removed, the fixing material 3 which is exposed as a lowermost layer is removed. In this manner, the insulating layer (encapsulation resin layer) 6 is formed in a form of a substrate (in a flat form). Further, a rear surface of the semiconductor chip 4 is exposed from a rear surface of the insulating layer (encapsulation resin layer) 6. Furthermore, the rear surface of the semiconductor chip 4 is substantially flush with the rear surface of the insulating layer (encapsulation resin layer) 6 and the rear surfaces of two layers 4, 6 are almost flat. Thus, it is possible to decrease the thickness of the semiconductor package 1 and also improve the heat-dissipation property of the semiconductor package 1.

The fixing material 3 made of the epoxy resin may be removed using a polishing method (grinding, polishing or CMP methods). In the meanwhile, it is much easier to polish the fixing material 3 made of the epoxy resin than to polish the molding resin.

In an alternative way, when thermally removable adhesive agent is used as the fixing material 3, by heating the fixing material 3 at a given temperature after the process as shown in FIG. 8, the adhesive ability of the fixing material 3 disappears. Thus, the semiconductor package 1, the fixing material 3 and supporting substrate 2 are separated from each other between the fixing material 3 and the semiconductor chip 4 and between the fixing material 3 and the insulating layer 6, and thus it is possible to manufacture the semiconductor package 1 more easily.

The semiconductor package 1 according to the present invention is manufactured through the above-mentioned processes.

In this embodiment, in practice, a plurality of the semiconductor chips 4 are mounted on the supporting substrate 2. After the fixing material 3 and the supporting substrate 2 are removed. Next, the insulating layers 6, 12, 14, . . . , and the solder resist film 16 are cut such that each cut portion includes at least one semiconductor chip 4, thereby obtaining a plurality of the semiconductor packages 1 at one time.

In one example, the semiconductor package 1 is in a form of a substrate (in a flat form) whose top plan shape is a rectangular shape and the dimension thereof is about width 15 mm×depth 15 mm×thickness 0.44 mm.

Moreover, in the semiconductor package 1, the sum of thicknesses of all wiring layers 11, 13 and all insulating layers 12, 14 and the solder resist film 16 is much smaller than that of the insulation layer 6 (encapsulation resin layer).

According to the above mentioned semiconductor package and the method for manufacturing the same, the top surface of the encapsulation resin layer is polished until the top surfaces of the pads of the semiconductor chip are exposed or the top surfaces of the pads are further polished after and in addition to such polishing. Accordingly, the encapsulation resin layer is prevented from remaining on the surfaces of the pads of the semiconductor chip. Hence, in forming the wiring layer, a good electrical connection between the pad and the wiring layer is achieved, so that the electrical connection errors can be prevented.

Since the top surface of the encapsulation resin layer is polished until the top surfaces of the pads of the semiconductor chip are exposed, the top surfaces of the pads as well as the top surface of the insulating layer made of the molding resin become a flat surface with high precision level. Accordingly, it is possible to build up, with high precision level, each layer of the semiconductor package having the multilayer structure formed through the build-up process.

The manufacturing process (in particular, the build-up process) can be performed using the supporting substrate made of metal material with high rigidity. Accordingly, the semiconductor package is prevented from bending or waving in the manufacturing process. The bending prevention is effective in that cracks are suppressed from occurring in the semiconductor package. Further, the supporting substrate made of the copper can be easily removed.

Further, since the supporting substrate can be removed from the semiconductor package and the insulating layer made of the molding resin is not formed between the removed supporting substrate and the semiconductor chip, it is possible to manufacture the semiconductor package with thin thickness.

Furthermore, because the fixing material also can be removed, it is possible to manufacture the semiconductor package with much further thin thickness.

Lastly, regions around the pads on the active surface of the semiconductor chip are covered only with molding resin, it is possible to solve a problem that cracks occur in connection portions between the pad and the vias.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A method of manufacturing a semiconductor package, the method comprising:
    (a) providing a semiconductor chip having a first surface and a second surface opposite to the first surface, wherein a pad is formed on the first surface;
    (b) disposing the semiconductor chip on the supporting substrate through a fixing material such that the first surface is directed upward;
    (c) forming an encapsulation resin layer on the supporting substrate so as to cover the semiconductor chip;
    (d) polishing the encapsulation resin layer to expose a top surface of the pad;
    (e) forming an insulating layer on the encapsulation resin layer;
    (f) forming a wiring layer on the insulating layer, wherein the wiring layer includes a via connected to the pad and a wiring pattern, wherein step (e) and step (f) are alternately repeated; and
    (g) removing the supporting substrate and the fixing material,
    wherein the fixing material is a thermally removable adhesive agent, and step (g) includes heating the fixing material after step (f) until the supporting substrate and the fixing material separate from the semiconductor package.

2. The method of claim 1, wherein the encapsulation resin layer is formed by a mold.

3. The method of claim 1, wherein
    an uppermost wiring layer includes an external connection pad, and
    the method further comprises:
    forming a solder resist film on the uppermost wiring layer, the solder resist film formed to have an opening through which the external connection pad is exposed.

4. The method of claim 3, wherein a sum of thickness of all wiring layers and all insulating layers and the solder resist film is smaller than that of the encapsulation resin layer.

5. The method of claim 4, wherein, in step (g), the supporting substrate and the fixing material are removed to expose the second surface of the semiconductor chip from one surface of the encapsulation resin layer so that the second surface of the semiconductor chip is flush with the one surface of the encapsulation resin.

6. The method of claim 5, wherein, in step (d), the encapsulation resin layer is polished to expose the top surface of the pad so that the top surface of the pad is flush with a surface of the encapsulation resin layer that is opposite to said one surface.

7. A method of manufacturing a semiconductor package, the method comprising:
    (a) providing a semiconductor chip having a first surface and a second surface opposite to the first surface, wherein a pad is formed on the first surface;
    (b) disposing the semiconductor chip on a supporting substrate such that the first surface is directed upward;
    (c) forming an encapsulation resin layer on the supporting substrate so as to cover the semiconductor chip;
    (d) polishing the encapsulation resin layer to expose a top surface of the pad;
    (e) forming an insulating layer on the encapsulation resin layer; and
    (f) forming a wiring layer on the insulating layer, wherein the wiring layer includes a via connected to the pad and a wiring pattern,
    wherein
    step (e) and step (f) are alternately repeated,
    an uppermost wiring layer includes an external connection pad,
    the method further comprises forming a solder resist film on the uppermost wiring layer, the solder resist film formed to have an opening through which the external connection pad is exposed, and
    a sum of thickness of all wiring layers and all insulating layers and the solder resist film is smaller than that of the encapsulation resin layer.

8. The method of claim 7, wherein the encapsulation resin layer is formed by a mold.

9. The method of claim 7, wherein the method further comprises:
    (g) removing the supporting substrate to expose the second surface of the semiconductor chip from one surface of the encapsulation resin layer so that the second surface of the semiconductor chip is flush with the one surface of the encapsulation resin.

10. The method of claim 9, wherein, in step (d), the encapsulation resin layer is polished to expose the top surface of the pad so that the top surface of the pad is flush with a surface of the encapsulation resin layer that is opposite to said one surface.

11. The method of claim 7, further comprising:
(g) removing the supporting substrate.

12. The method of claim 11, wherein the supporting substrate is made of metal, and
wherein step (g) comprises removing the supporting substrate by etching.

13. The method of claim 11, wherein step (b) comprises: disposing the semiconductor chip on the supporting substrate through a fixing material, the fixing material is made of resin, and
the method further comprising:
(h) removing the fixing material after step (g) by polishing.

* * * * *